(12) United States Patent
Wang

(10) Patent No.: US 8,154,319 B2
(45) Date of Patent: Apr. 10, 2012

(54) THREE-DIMENSIONAL ARCHITECTURE FOR INTEGRATION OF CMOS CIRCUITS AND NANO-MATERIAL IN HYBRID DIGITAL CIRCUITS

(75) Inventor: Wei Wang, Niskayuna, NY (US)

(73) Assignee: The Research Foundation of State University of New York, Albany, NY (US)

( * ) Notice: Subject to any disclaimer, the term of this patent is extended or adjusted under 35 U.S.C. 154(b) by 199 days.

(21) Appl. No.: 12/529,403

(22) PCT Filed: Mar. 27, 2008

(86) PCT No.: PCT/US2008/058366
§ 371 (c)(1),
(2), (4) Date: Feb. 4, 2010

(87) PCT Pub. No.: WO2008/121676
PCT Pub. Date: Oct. 9, 2008

(65) Prior Publication Data
US 2010/0133587 A1  Jun. 3, 2010

Related U.S. Application Data

(60) Provisional application No. 60/920,619, filed on Mar. 29, 2007.

(51) Int. Cl.
*H03K 19/162* (2006.01)
(52) U.S. Cl. .............. 326/41; 326/38; 438/199; 977/762
(58) Field of Classification Search ........................ None
See application file for complete search history.

(56) References Cited

U.S. PATENT DOCUMENTS

| 6,297,063 | B1 | 10/2001 | Brown et al. |
| 2004/0041617 | A1* | 3/2004 | Snider et al. .................. 327/365 |
| 2006/0267214 | A1 | 11/2006 | Schmid et al. |

OTHER PUBLICATIONS

Dmitri B Strukov et al: "CMOL FPGA: a reconfigurable architecture for hybrid digital circuits with two-terminal nanodevices; CMOL FPGA: a reconfigurable architecture for hybrid digital circuits with two-terminal nanodevices" Nanotechnology, IOP, Bristol, GB, vol. 16, No. 6, Jun. 1, 2005, pp. 888-900, XP020091102.

(Continued)

*Primary Examiner* — N Drew Richards
*Assistant Examiner* — Peter Bradford
(74) *Attorney, Agent, or Firm* — Kevin P. Radigan, Esq.; Heslin Rothenberg Farle & Mesiti P.C.

(57) ABSTRACT

A hybrid CMOL stack enables more efficient design of CMOS logical circuits. The hybrid CMOL structure includes a first substrate having a CMOS device layer on the substrate, a first interconnect layer with interface pins over the CMOS device layer of the first substrate, a first array of nanowires connected to the interface pins of the first interconnect layer, a layer of nanowire junction material over the first array of nanowires, a second array of nanowires over the nanowire junction material, a second interconnect layer having interface pins disposed over the second array of nanowires, the interface pins being connected to the second array of nanowires, and a second substrate, the second substrate including a second CMOS device layer disposed over the second interconnect layer.

15 Claims, 5 Drawing Sheets

OTHER PUBLICATIONS

Dmitri B Strukov et al: "Prospects for terabit-scale nanoelectronic memories; Prospects for terabit-scale nanoelectronic memories" Nanotechnology, IOP, Bristol, GB, vol. 16, No. 1, Jan. 1, 2005.

Stan M R et al: "CMOS/nano co-design for crossbar-based molecular electronic systems" IEEE Transactions on Nanotechnology, IEEE Service Center, Piscataway, NJ, US, vol. 2, No. 4, Dec. 1, 2003 pp. 217-230, XP011106886.

Fujita S et al: "Two-terminal Si-nanocrystal memory formed between the two metal layers" Nanotechnology, 2003. IEEE-NANO 2003. 2003 Third IEEE Converence on Aug. 12-14, 2003, Piscataway, NJ, USA, IEEE, vol. 2, Aug. 12, 2003, pp. 760-762, XP010657718.

Database Inspec, The Institution of Electrical Engineers, Stevenage, GB; Inspec No. AN 10019274 Jun. 1, 2007, Tu D, Lui M, Wang W, Haruehanroengra S: "Three-dimebsuibak CMOL; three-dimensional integration of CMOS/nanomaterial hybrid digital circuits" XP002490551.

International Search Report for PCT/US2008/058366, dated Jul. 31, 2008.

* cited by examiner

US 8,154,319 B2

THREE-DIMENSIONAL ARCHITECTURE FOR INTEGRATION OF CMOS CIRCUITS AND NANO-MATERIAL IN HYBRID DIGITAL CIRCUITS

CROSS REFERENCE TO RELATED APPLICATIONS

This application is a national stage filing under section 371 of International Application No. PCT/US2008/058366, filed on Mar. 27, 2008, and which claims priority of U.S. Provisional application No. 60/920,619 filed on Mar. 29, 2007, the entire disclosure of these applications being hereby incorporated herein by reference.

TECHNICAL FIELD

The present invention relates generally to complementary metal oxide semiconductor (CMOS) circuit architecture and, in particular, to the integration of CMOS circuits with nano-material.

BACKGROUND OF THE INVENTION

The use of nano-materials with electronic circuit devices to establish field programmable gate array (FPGA) type structures has resulted in different device fabrication methods. One particular method is a cell-based architecture called hybrid nanowire/molecular/semiconductor circuit, which is sometimes referred to as 'CMOL.' In this structure, high-density nanowire crossbars and molecular (nanowire junction or bistable junction) switches are fabricated on top of a CMOS stack to build a number of basic logical circuit cells in a logic memory arrangement. This technique is promoted as showing advantages over standard CMOS FPGA structure, such as device density and fault tolerance capabilities.

One key technique used in CMOL is an interface scheme of using special metal pins to provide the electrical connections between nanowires and the CMOS layer. As shown in FIG. 1, a portion 10 of a CMOL structure is depicted in a cross-sectional side view. The CMOS layer 12 supports two special metal pins 14 and 18 above an upper wiring level 13. Each special metal pin 14 and 18 has a different height to connect a CMOS cell electrically to a bottom nanowire 20 or a top nanowire 22. Between the nanowires 20 and 22 are nanodevices 24A, 24B, 24C, and 24D. The nanowires and nanodevices comprise a crossbar 28, generally. Providing metal pins of different heights is difficult to control during the fabrication process. Due to the uniformity of the cell structures, if a pin is misaligned so it connects to a wrong nanowire in one cell, the corresponding mismatch occurs in all other cells. Therefore, appropriate connection of the bottom and top nanowires to the cells in the CMOL structure is crucial.

Another limitation of CMOL structure arises from the high-density characteristics of the nanowires. For example, in the CMOL cell 30 shown in FIG. 2, four CMOS transistors 32, 34, 36, and 38 are provided, however, only the bottom and upper nanowires 40 and 42 may be used to connect to these transistors. More complex circuits requiring additional connections that are independent of the lower and the upper nanowires are not possible in the structure thus described.

SUMMARY OF THE INVENTION

A structure enabling more efficient utilization of the nanowire densities possible in CMOL is desirable. Additionally, a structure that facilitates the connection of the nanowires to the logical components in a cell so misalignment is less likely would also be useful.

Provided herein, in one aspect, is a method of fabricating a complementary metal oxide semiconductor (CMOS) molecular (CMOL) stack. The method includes: providing a first interconnect layer over a CMOS device layer of a first substrate, the first interconnect layer comprising interface pins electrically coupled to the CMOS device layer of the first substrate; providing a second interconnect layer over a CMOS device layer of a second substrate, the second interconnect layer comprising interface pins electrically coupled to the CMOS device layer of the second substrate; disposing a first array of nanowires over the first interconnect layer to electrically connect to the interface pins thereof; disposing a second array of nanowires over the second interconnect layer to electrically connect to the interface pins thereof; disposing a nanowire junction material over at least one of the first array of nanowires or the second array of nanowires; and forming a CMOL stack by positioning the first substrate and the second substrate so that the first array of nanowires and the second array of nanowires are in opposing relation across the nanowire junction material, thereby forming nanowire crossbar switches, the nanowire crossbar switches bonding the first interconnect layer and the second interconnect layer together, thereby forming the CMOL stack.

In another aspect, a hybrid complementary metal oxide semiconductor (CMOS) molecular (CMOL) structure is provided. The CMOL structure includes: a first substrate having a first CMOS device layer thereon; a first interconnect layer disposed over the first CMOS device layer of the first substrate, the first interconnect layer including interface pins electrically coupled to the first CMOS device layer; a layer of nanowire crossbar switches disposed over the first interconnect layer and electrically connected to the interface pins thereof, the layer of nanowire crossbar switches comprising a first array of nanowires connected to the interface pins of the first interconnect layer, a nanowire junction material disposed over the first array of nanowires, and a second array of nanowires disposed over the nanowire junction material; a second interconnect layer comprising interface pins disposed over the second array of nanowires with the interface pins of the second interconnect layer electrically connected to the second array of nanowires; and a second substrate comprising a second CMOS device layer disposed over the second interconnect layer, wherein the interface pins of the second interconnect layer electrically connect the second CMOS device layer to the second array of nanowires.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
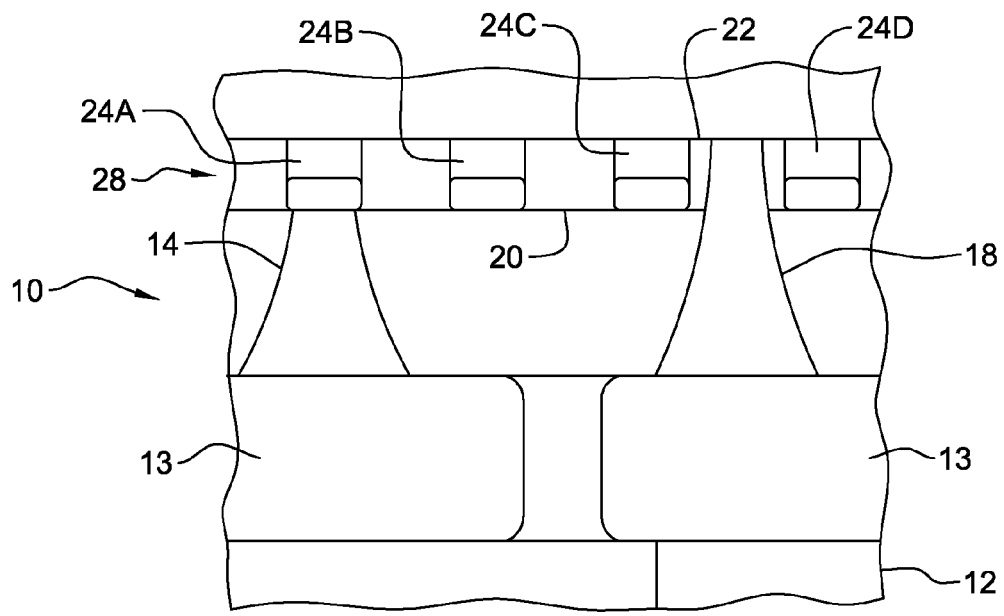
FIG. 1 is a diagram of a prior art structure for integrating CMOS devices with nano-material using interface pins.
Figure 2:
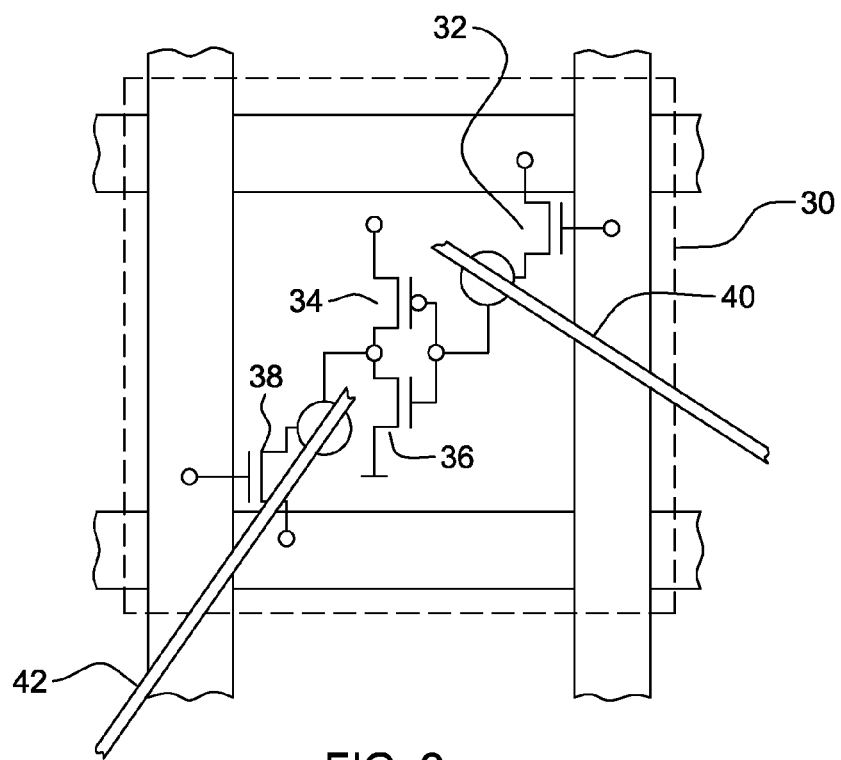
FIG. 2 is a schematic of the connections made to integrate CMOS devices with nano-material in the prior art.
Figure 3:
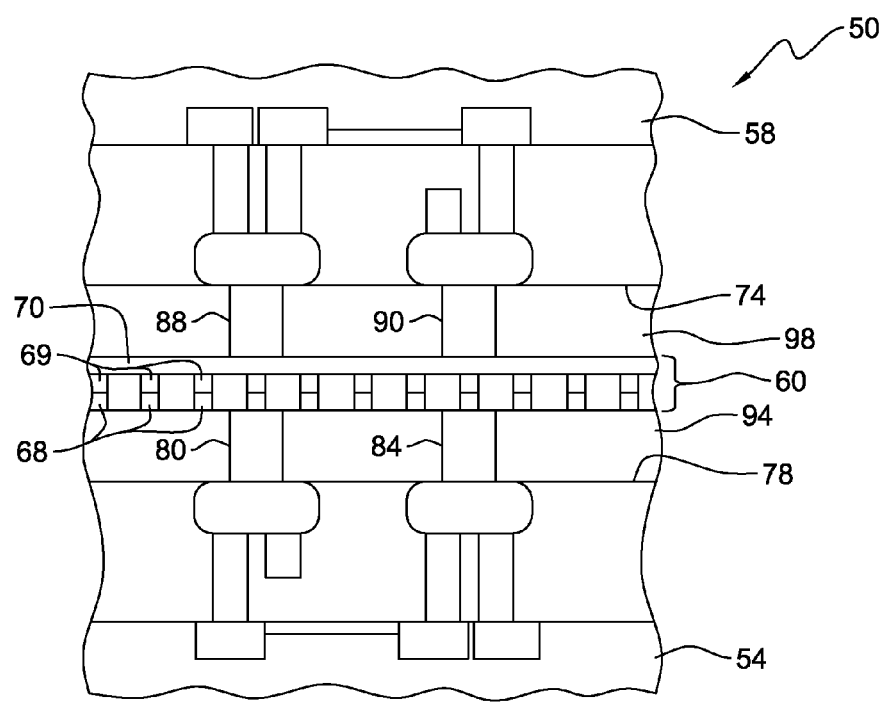
FIG. 3 is a diagram of vertically stacked CMOS substrates with nano-material and interconnect layers bonded between them, in accordance with an aspect of the present invention.

As shown in FIG. 3, a three dimensional (3D) CMOL structure is depicted that overcomes the limitations of previously known CMOL structures. The 3D CMOL structure 50 includes two face-to-face stacks of CMOS circuits 54, 58 and nanowire crossbar switches 60 in an intervening layer. "Face-to-face" means that the CMOS structures are oriented in the stack so the CMOS device layers formed on the respective substrates face one another. Bottom and top arrays of nanowires 68, 70 in the nanowire crossbar switch layer 60 are connected to the bottom 74 and top 78 of the CMOS structures, respectfully, by separated interface pins 80, 84, 88, and 90. Interface pins 80, 84 are within a first interconnect layer 94 and interface pins 88, 90 are within a second interconnect layer 98. The interface pins may be metal or any other suitable conductive material, including superconductive materials. This structure enables the CMOS cells to be coupled to the nanowire crossbar switches 60 in a manner that reduces the risk of connecting to the wrong nanowire.

The nanowire crossbar switches 60 comprise the bottom array of nanowires 68, top array of nanowires 70 and a layer of nanowire junction material 69, disposed between the arrays. This nanowire junction material may comprise, for example a layer of electrical bistable molecules disposed between the nanowire arrays. Further, nano-crystals may be formed within the nanowire junction material to enhance performance. For example, in order to enhance switching properties of the nanowire junction material (or nano junction material), nano-crystals may be formed when preparing the nano junction material. By way of example, if $ZrO_2$ is to be employed as the nano junction material, then three sequential layers of $ZrO_2/Cu/ZrO_2$ may be grown, for example, to a thickness of 20/3/20 nm using e-beam evaporation. The extremely thin layer of Cu becomes Cu nano-crystals during the annealing processes, resulting in $ZrO_2$ nano junction material with Cu nano-crystals inside. Measurement results demonstrate that IV switching properties of these nano-junctions is significantly improved.

Figure 7:
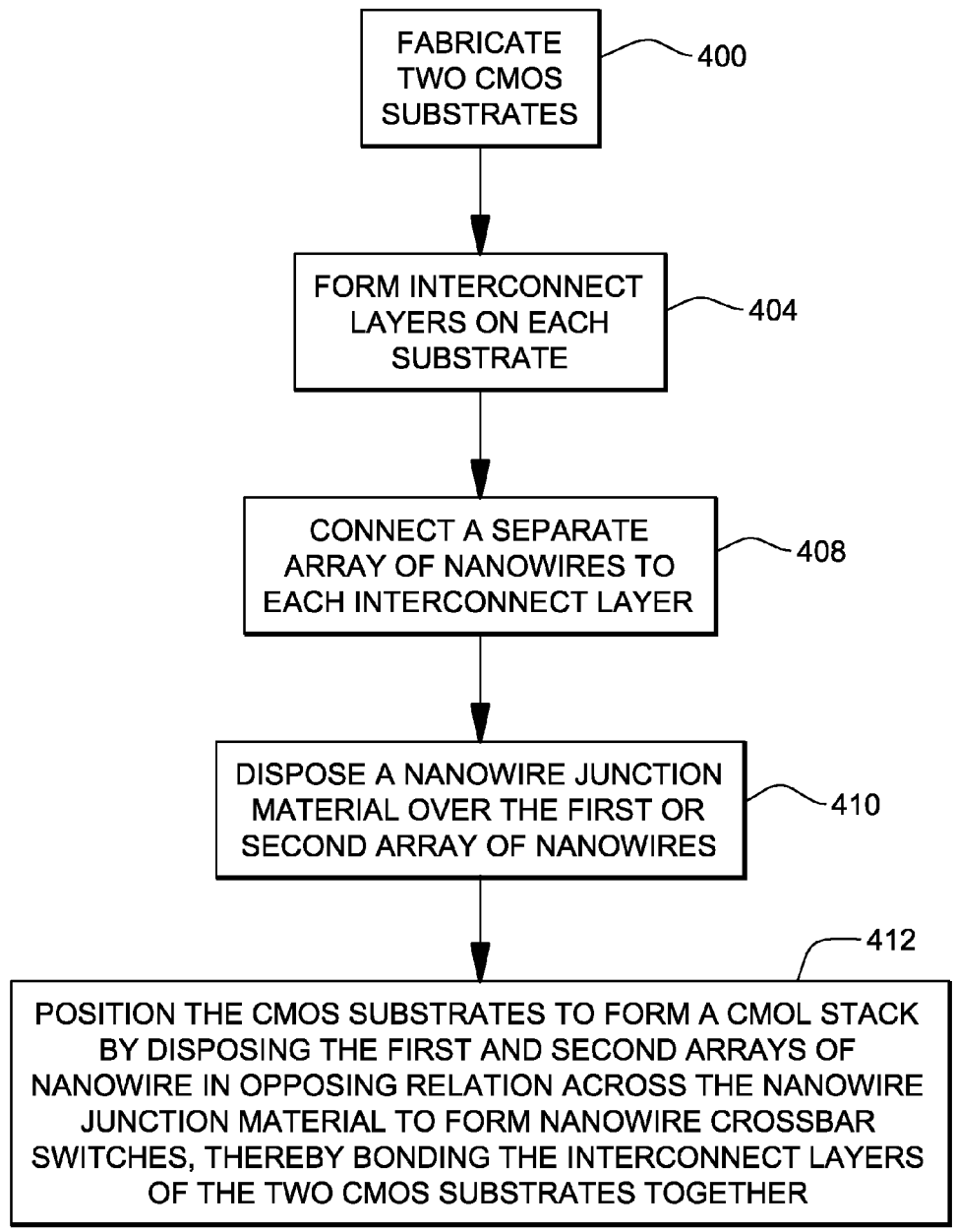
FIG. 7 is a flow diagram of a process to form a CMOL stack, in accordance with an aspect of the present invention.

One fabrication process to produce the structure shown in FIG. 3 is depicted in FIG. 7. Referring collectively to FIGS. 3 & 7, the process begins with the fabrication of separate CMOS substrates 54, 58 (block 400). Each CMOS substrate has a CMOS device layer formed on the substrate material, which may be silicon, for example. An interconnect layer 94, 98 is formed on top of each CMOS device layer of the CMOS substrates 54, 58, respectively (block 404). The interconnect layer 94 contains the interface pins 80, 84, while the interconnect layer 98 contains the interface pins 88, 90, which electrically connect to one or more wiring levels of the underlying CMOS device layer. An array of nanowires 68 is formed aligned and connected to the pins of the CMOS substrate 54 and another array of nanowires 70 is separately formed aligned and connected to the pins of the CMOS substrate 58 (block 408). The alignment of the arrays with the respective CMOS substrates is not critical due to the regularity of the cell structures in CMOL. A nanowire junction material, such as a layer of electrical bistable molecules, may be inserted on top of the array of nanowires 68 and/or the array of nanowires 70 (block 410). Next, the CMOS substrates are positioned to form the CMOL stack by disposing the first and second arrays of nanowires in opposing relation across the nanowire junction material 69 to form the nanowire crossbar switches 60, and thereby bond the interconnect layers 94, 98 together (block 412). The two CMOS substrates may be positioned relative to each other using an aligner. Using an aligner to position two substrates is a well-established technique used to construct three-dimensional integrated circuits. Precise alignment of the two CMOS substrates is not required because the two arrays of nanowires 68, 70 can be used to build a crossbar switch at numerous angles.

Figure 4:
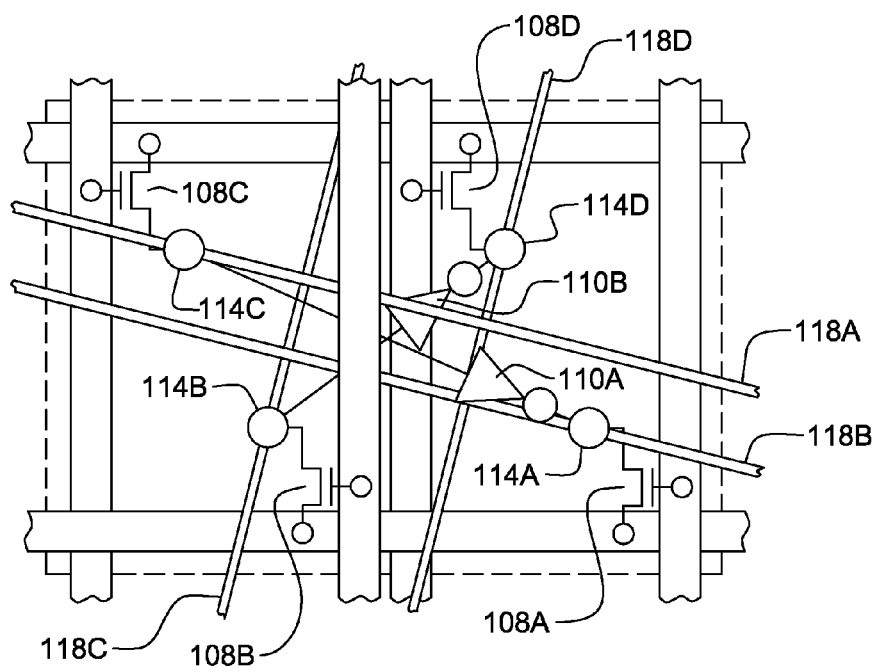
FIG. 4 is a schematic of connections integrating vertically stacked CMOS circuits, in accordance with an aspect of the present invention.

The basic unit of the 3D CMOL, which is shown in FIG. 3, is equivalent to two 2D CMOL cells. For the same footprint of a single 2D CMOL cell, one 3D unit consists of four pass transistors (108A, 108B, 108C, 108D), two inverters (110A, 110B), four pins (114A, 114B, 114C, 114D), and four nanowires (118A, 118B, 118C, 118D). These elements of a 3D CMOL cell are shown FIG. 4. Therefore, the number of interface pins and nanowire crossbars is doubled, which provides for more flexibility in making connections.

Figure 5:
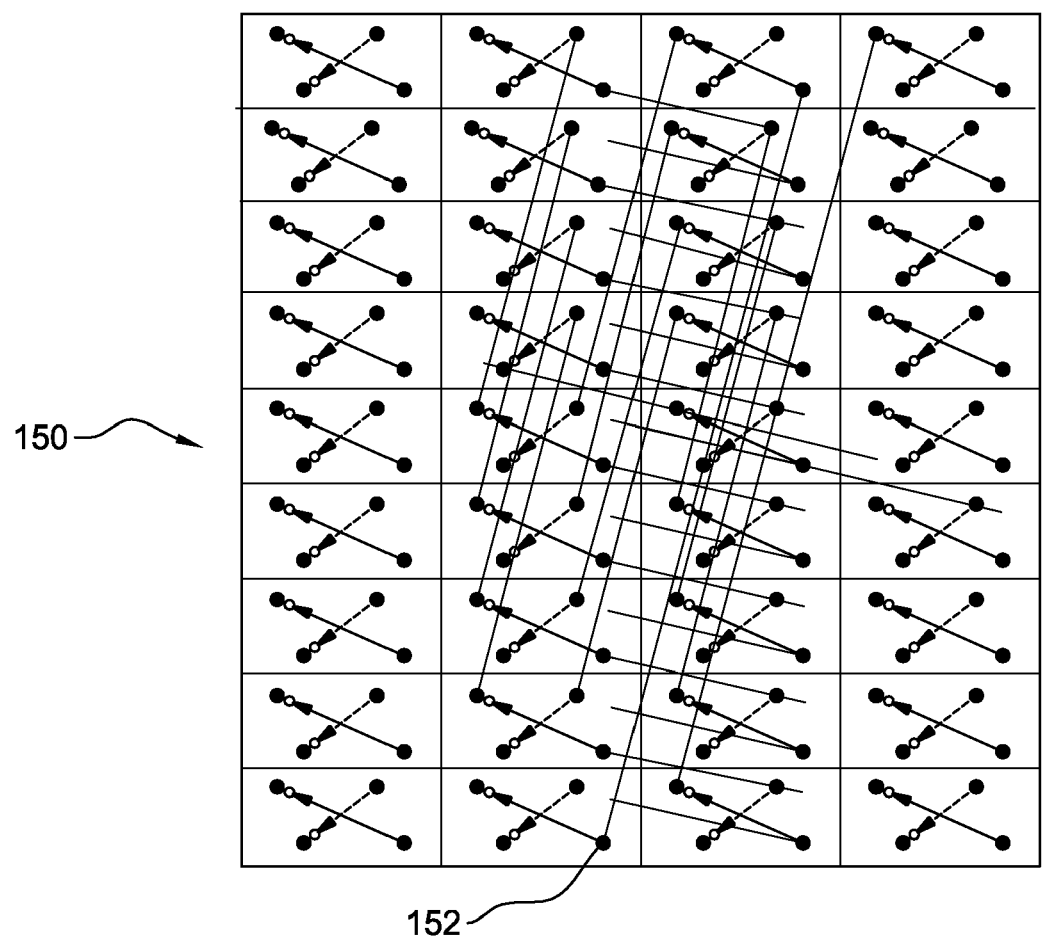
FIG. 5 depicts possible connections of a single CMOS circuit with a plurality of CMOS circuits in a stacked architecture, in accordance with an aspect of the present invention.

The connectivity of a 3D CMOL cell varies upon the arrangement of the interface pins. The connection case of a=4 and N=15 is shown in FIG. 5, where a is an integer defining the length of cell-to-cell interaction and N is the input cell connected to a given cell. In order for 3D CMOL units to operate, a configuration stage is required to program the switches as ON or OFF. In this stage, pass transistors from both top and bottom CMOS stacks of a 3D CMOL cell are used since both top and bottom nanowires are involved. As shown in FIG. 5, a four by nine matrix 150 of CMOL cells is shown. An input, such as input 152, in one of the cells of the matrix may be connected to fifteen other cells by crossing nanowires. Thus, the configuration stage enables a 3D CMOL cell to have high fault tolerance capabilities. After configuration, components in a unit can be operated independently in two CMOS layers.

Figure 6A:
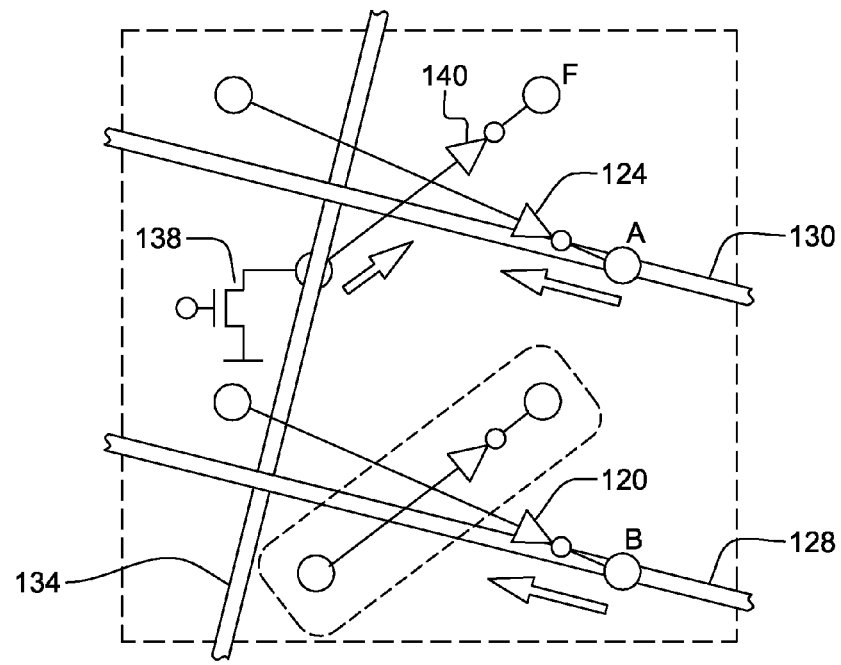
FIG. 6A depicts the connections between one and one-half vertically stacked CMOS circuits to produce an NOR gate, in accordance with an aspect of the present invention.
Figure 6B:
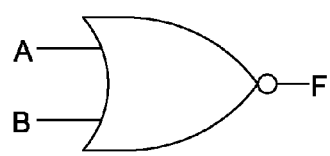
FIG. 6B is a schematic diagram of the electrical circuit produced by the connections shown in FIG. 6A for the NOR gate shown in FIG. 6C, in accordance with an aspect of the present invention.

By way of example, a NOR gate implementation using one and one-half CMOL cells is shown in FIG. 6A. The NOR gate inputs A and B and output F are identified in FIG. 6B. The output of the two inverters 120, 124 are provided by top nanowires 128, 130 through a crossbar switch to a bottom nanowire 134 for delivery to the drain of transistor 138. The voltage at the drain is then inverted by inverter 140 to provide the NOR gate output at F in the CMOS layer. In 2D CMOL, an NOR gate requires three cells for its implementation. Therefore, a 3D cell structure enables more efficient logic circuit design.

The footprint of a 3D CMOL cell is the same as that of a 2D CMOL cell. A cell area may be estimated as having four transistors and is approximately $A_0=(2\beta F_{CMOS})^2$, where the $F_{CMOS}$ is the half-pitch of the CMOS system and the scalar factor $\beta$ is selected as 4. For example, when 45 nm CMOS technology is used, the area of one cell or the footprint of one cell, $A_0$, is approximately 129,600 nm$^2$.

Figure 6C:
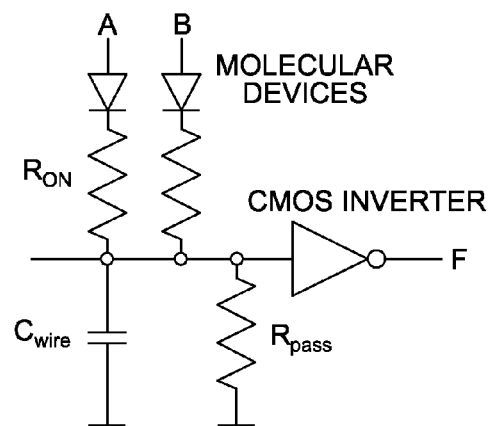
FIG. 6C is a depiction of the logical NOR gate implemented by the circuit of FIG. 6B and the connections of FIG. 6A, in accordance with an aspect of the present invention.

The delay of a 3D CMOL circuit depends on the number of logic stages. Using the equivalent electrical circuit, shown in FIG. 6C, for the NOR gate of FIG. 6A and FIG. 6B, the simplified RC delay of a logic stage is obtained as $\tau_0 \approx \log(2I) R_{pass}C_{wire}$, where I is the gate fan-in, $R_{pass}$ the resistance of a pass transistor, and $C_{wire}$, the capacitance of a nanowire. Thus, the $C_{wire}$ value is reduced, leading to a smaller delay. Another delay improvement may be obtained by reducing the interface pin height and local metal interconnect length as the capacitances of these pins and interconnects are in parallel to $C_{wire}$.

The power consumption of 2D or 3D CMOL circuits is estimated as the sum of static power $P_{on}$, leakage power $P_{leak}$ and dynamic power $P_d:P_{ON} \approx$ $$\frac{V_{DD}^2}{2R_{ser}}, \quad P_{leak} = \frac{MV_{DD}^2}{2R_{OFF}/D}, \quad P_D = \frac{C_{wire}V_{DD}^2}{4\tau_{total}},$$

where $R_{ser}$ is the serial resistance of the switch ON resistance and wire resistance, $R_{OFF}$ is the switch OFF resistance, D is the total number of molecular switches in one nanowire crosspoint, M is the number of closed crosspoint switches and $\tau_{total}$ is the total RC delay. The power consumption of a 2D CMOL cell is predicted as $P_0=P_{AREA}\times$area of cell=0.2592 µW where the power density $P_{AREA}$=200 W/cm$^2$. The power estimation of 3D CMOL needs to account for smaller nanowires. Thus, as $R_{wire}$ increases and $C_{wire}$ is reduced accordingly, unit power consumption approaches 2 $P_0$, which indicates high power density. A performance comparison of several 2D and 3D CMOL circuits is given in Table 1.

TABLE 1

Comparison of Logic Design Using 2D CMOL and 3D CMOL Methods

| | 2D CMOL | | | | 3D CMOL | | | |
|---|---|---|---|---|---|---|---|---|
| | No. of Cells | Footprint Required | Delay | Power Dissipation (same speed) | No. of Cells | Footprint Required | Delay | Power Dissipation (same speed) |
| MUX | 7 Cells | 7 $A_0$ | 4 $\tau_0$ | 7 $P_0$ | 3.5 Cells | 3.5 $A_0$ | Less than 4 $\tau_0$ | Around 7 $P_0$ |
| XOR | 6 Cells | 7 $A_0$ | 3 $\tau_0$ | 6 $P_0$ | 3 Cells | 3 $A_0$ | Less than 3 $\tau_0$ | Around 6 $P_0$ |
| Full Adder | 22 Cells | 22 $A_0$ | 6 $\tau_0$ | 22 $P_0$ | 11 Cells | 11 $A_0$ | Less than 6 $\tau_0$ | Around 22 $P_0$ |

As can be seen from Table 1, 3D CMOL, when compared with 2D CMOL, improves footprint and speed performance while maintaining similar power consumption.

While a 2-stack 3D CMOL has been disclosed in the discussion above, a multiple-stack structure may be easily achieved by bonding several CMOL stack structures together through back-to-back bonds. Additionally, an interface layer may be inserted between the CMOS substrate surfaces that are bonded together. The interface layer may be, for example, an electrical insulation layer or a thermally conductive layer, such as a heat sink. Therefore, the 3D CMOL structure set forth above may viewed as a general 3D structure for CMOL stacks.

Those skilled in the art will recognize that numerous modifications can be made to the specific implementations described above. While the embodiments above have been described with reference to specific applications, embodiments addressing other applications may be developed without departing from the principles of the invention described above. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A method of fabricating a complementary metal oxide semiconductor (CMOS) molecular (CMOL) stack, the method comprising:
   providing a first interconnect layer over a CMOS device layer of a first substrate, the first interconnect layer comprising interface pins electrically coupled to the CMOS device layer of the first substrate;
   providing a second interconnect layer over a CMOS device layer of a second substrate, the second interconnect layer comprising interface pins electrically coupled to the CMOS device layer of the second substrate;
   disposing a first array of nanowires over the first interconnect layer to electrically connect to the interface pins thereof;
   disposing a second array of nanowires over the second interconnect layer to electrically connect to the interface pins thereof;
   disposing a nanowire junction material over at least one of the first array of nanowires or the second array of nanowires; and
   forming a CMOL stack by positioning the first substrate and the second substrate so that the nanowire junction material is disposed between the first array of nanowires and the second array of nanowires, thereby forming nanowire crossbar switches, the nanowire crossbar switches bonding the first interconnect layer and the second interconnect layer together, thereby forming the CMOL stack.

2. The method of claim 1, wherein the nanowire junction material comprises a layer of bistable junction material.

3. The method of claim 1, wherein disposing the nanowire junction material further comprises forming nano-crystals within the nanowire junction material, the nano-crystals enhancing switching properties of the nanowire crossbar switches.

4. The method of claim 3, wherein forming nano-crystals within the nanowire junction material comprises providing a thin layer of metal material within the nanowire junction material and converting the thin layer of metal material into metal nano-crystals during an annealing process, thereby obtaining metal nano-crystals disposed within the nanowire junction material.

5. The method of claim 1, wherein disposing the first array of nanowires comprises establishing a first planar array of nanowires over the first interconnect layer.

6. The method of claim 5, wherein disposing the second array of nanowires comprises establishing a second planar array of nanowires over the second interconnect layer.

7. The method of claim 6, wherein the first planar array of nanowires comprises a first plurality of parallel-disposed nanowires, and the second planar array of nanowires comprises a second plurality of parallel-disposed nanowires.

8. The method of claim 1, wherein the CMOL stack comprises a first CMOL stack, and wherein the method further comprises forming a second CMOL stack, and bonding a surface of the first CMOL stack to a surface of the second CMOL stack to form a third, extended CMOL stack, wherein the bonding comprises inserting an interface layer between the surface of the first CMOL stack and the surface of the second CMOL stack before bonding of the stacks together.

9. A hybrid complementary metal oxide semiconductor (CMOS) molecular (CMOL) structure comprising:
a first substrate having a first CMOS device layer thereon;
a first interconnect layer disposed over the first CMOS device layer of the first substrate, the first interconnect layer comprising interface pins electrically coupled to the first CMOS device layer;
a layer of nanowire crossbar switches disposed over the first interconnect layer and electrically connected to the interface pins thereof, the layer of nanowire crossbar switches comprising a first array of nanowires connected to the interface pins of the first interconnect layer, a nanowire junction material disposed over the first array of nanowires, and a second array of nanowires disposed over the nanowire junction material;
a second interconnect layer comprising interface pins disposed over the second array of nanowires with the interface pins of the second interconnect layer electrically connected to the second array of nanowires; and
a second substrate comprising a second CMOS device layer disposed over the second interconnect layer, wherein the interface pins of the second interconnect layer electrically connect the second CMOS device layer to the second array of nanowires.

10. The CMOL structure of claim 9, wherein the nanowire junction material comprises a layer of bistable junction material.

11. The CMOL structure of claim 9, wherein the nanowire junction material comprises nano-crystals within the nanowire junction material to enhance switching properties of the nanowire crossbar switches.

12. The CMOL structure of claim 11, wherein the nano-crystals comprise metal nano-crystals within the nanowire junction material.

13. The CMOL structure of claim 9, wherein the first array of nanowires comprises a first planar array of nanowires, the second array of nanowires comprises a second planar array of nanowires, and wherein the first planar array of nanowires comprises a first plurality of parallel-oriented nanowires and the second planar array of nanowires comprises a second plurality of parallel-oriented nanowires.

14. The CMOL structure of claim 9, wherein the CMOL structure comprises a first CMOL structure, and wherein a second CMOL structure resides over the first CMOL structure, the second CMOL structure comprising:
a third substrate having a third CMOS device layer thereon;
a third interconnect layer disposed over the third CMOS device layer of the third substrate, the third interconnect layer comprising interface pins electrically coupled to the third CMOS device layer;
a layer of nanowire crossbar switches disposed over the third interconnect layer and electrically connected to the interface pins thereof, the layer of nanowire crossbar switches comprising a third array of nanowires connected to the interface pins of the third interconnect layer, a nanowire junction material disposed over the third array of nanowires, and a fourth array of nanowires disposed over the nanowire junction material;
a fourth interconnect layer comprising interface pins disposed over the fourth array of nanowires, with the interface pins of the fourth interconnect layer electrically connected to the fourth array of nanowires; and
a fourth substrate comprising a fourth CMOS device layer disposed over the fourth interconnect layer, wherein the interface pins of the fourth interconnect layer electrically connect the fourth CMOS device layer to the fourth array of nanowires.

15. The CMOL structure of claim 14, wherein the first CMOL structure and the second CMOL structure are coupled across an interface layer, the interface layer comprising a thermally conductive layer or an electrically insulating layer.

* * * * *